United States Patent [19]

Zimmermann et al.

[11] Patent Number: 5,453,728
[45] Date of Patent: Sep. 26, 1995

[54] RHEOSTATIC DEVICE IN A SWITCHING ARRANGEMENT FOR ELECTRIC TOOLS

[75] Inventors: Bernhard Zimmermann, Tuttlingen; Gerhard Niklewski, Trossingen, both of Germany

[73] Assignee: Marquardt GmbH, Riehteim-Weilheim, Germany

[21] Appl. No.: 962,792

[22] PCT Filed: Jun. 27, 1991

[86] PCT No.: PCT/DE91/00529

§ 371 Date: Dec. 28, 1992

§ 102(e) Date: Dec. 28, 1992

[87] PCT Pub. No.: WO92/00594

PCT Pub. Date: Jan. 9, 1992

[30] Foreign Application Priority Data

Jun. 27, 1990 [DE] Germany .............. 40 20 452.9
Feb. 27, 1991 [DE] Germany .............. 41 06 177.2

[51] Int. Cl.⁶ .......................... H01C 10/36; H01C 10/50
[52] U.S. Cl. ............................ 338/173; 338/179; 338/195; 338/198; 338/200; 338/201; 338/313
[58] Field of Search ............................. 338/200, 201, 338/173, 179, 332, 198, 312, 195–313; 388/840

[56] References Cited

U.S. PATENT DOCUMENTS

| | | | |
|---|---|---|---|
| 2,193,964 | 3/1940 | Hastings | 338/173 |
| 2,902,664 | 9/1959 | DePuy . | |
| 3,543,120 | 11/1970 | Robertson | 388/840 |
| 3,909,770 | 9/1975 | Oka et al. . | |
| 4,580,030 | 4/1986 | Takeuchi | 338/195 X |
| 4,734,672 | 3/1988 | Kawana et al. | 338/312 |

FOREIGN PATENT DOCUMENTS

| | | |
|---|---|---|
| 0110216A1 | 6/1984 | European Pat. Off. . |
| 1472353 | 3/1967 | France . |
| 2114290 | 9/1972 | Germany . |
| 2932715A1 | 3/1981 | Germany . |
| 3041711A1 | 5/1982 | Germany . |
| 3148778C2 | 12/1982 | Germany . |
| 3632511A1 | 4/1987 | Germany . |
| 3713075A1 | 10/1987 | Germany . |
| 3741175A1 | 6/1988 | Germany . |
| 3841794A1 | 6/1989 | Germany . |
| 2205691A | 12/1988 | United Kingdom . |

*Primary Examiner*—Marvin M. Lateef
*Attorney, Agent, or Firm*—Spencer, Frank & Schneider

[57] ABSTRACT

An electric tool rheostatic device in a switching arrangement is provided for regulating the speed of an electric motor in an electric tool. A circuit board for receiving electronic components is disposed in a switch housing. A potentiometer disposed within the switch housing includes a potentiometer slider operatively connected with a manually-operated actuating member and a resistance track that is constituted by a chip resistance element produced independently of the circuit board according to surface mounted device technology and mounted on the circuit board independently of the potentiometer slider. Upon assembly of the switching arrangement the potentiometer slide is adjustably located on the resistance track by the manually-operated actuating member for controlling resistance.

17 Claims, 4 Drawing Sheets

RHEOSTATIC DEVICE IN A SWITCHING ARRANGEMENT FOR ELECTRIC TOOLS

BACKGROUND OF THE INVENTION

The invention relates to a rheostatic device in a switching arrangement, particularly for controlling the speed of electric motors or the like, including a switch housing and a circuit board disposed in the switch housing for receiving electronic components. A resistance track is provided on the circuit board for controlling resistance. A potentiometer slider slides on the resistance track using an actuating member.

A continuous control of the speed of electric tools such as, for example, drilling machines, is effected by means of electronic switches or electronics modules. The actuation of a push button or of an adjusting wheel acts on a controlling element which results in a change in an electric measured quantity. In general, a potentiometer is used as the controlling element which is constructed as a part of the switch or of the electronics module. In this arrangement, the push-button or the adjusting wheel is provided with a potentiometer slider which slides on an associated resistance track. This is printed onto a large-area carrier board or circuit board, the circuit board usually being used at the same time as carrier for circuit tracks and other electric constructional elements and other components.

Special technologies are applied in producing circuit boards. Due to the different requirements, various basic materials—so-called hard papers—are used. These are, for example, copper-clad hard paper on phenolic resin base on epoxy resin base or copper-clad laminated pressed material of epoxy resin glass silk fabric, that is to say glass-fibre reinforced. The basic material can be provided on one side or on both sides with a copper foil, the copper foil being protected with an etching varnish in the screen printing method or with a photoresist in the photographic method at the points at which the conductor runs and soldering eyes are to be produced. The exposed copper is then etched away.

If such a circuit board is to be additionally provided with a potentiometer track or resistance track, this is also applied, for example in a screen printing method, in the form of a paste onto the base material and fired. During this processing operation, however, the copper conductor tracks already produced are influenced by oxidation so that post-treatment is again required. In particular, negative chemical and thermal interactions occur between the etched circuit board and the applied resistance track during the firing processes. The resistance value of the applied resistance track is then subject to a very large manufacturing tolerance which is caused by material and production processes. This tolerance can be up to ±20% of the nominal resistance value. The additional application of a carbon layer track as a resistance track on a circuit board also represents an additional production risk in the production of the switch or electronics module. Furthermore, the resistance track applied in known technology to the circuit board is susceptible to environmental influences such as, for example, humidity, temperature and furthermore to out-gassing of the carrier material during the firing process of the conductor track which results in a drift characteristic of the electrical value both during the production and during the utilization.

The production of a resistance track on the existing circuit board of a switch or of an electronics module in conjunction with the utilization of firing pastes (R paste) also has the disadvantage of increased wear during operation if only lower firing temperatures can be used due to the carrier materials used.

The application of resistance tracks to circuit boards to be equipped conventionally for producing a switch or an electronics module does not allow optimum handling of the circuit board itself. In particular, there is no control characteristic occurring analogously to the remaining electronic components arranged on the circuit board which, however, would be required for automatic, modern production of fully electronic units.

The so-called SMD (surface mounted device) technology was introduced into industrial products some years ago. In particular, this technology is used for thin film and thick film circuits but also for miniaturizing board structures. The basis of this new technology is formed by miniaturized components (SMDs=surface mounted devices) which are directly mounted on the surface of circuit boards or ceramic substrates. In particular, SMD chips are also suitable for processing by means of automatic insertion equipment and for all soldering methods, such as, for example, dip soldering or reflow soldering. After being fixed to the circuit board by means of an adhesive drop they can therefore be moved together with this board through the soldering bath. SMDs can be used on one side of the circuit board, on both sides or in mixed equipment with conventionally wired components. The mixed equipment is suitable when the intended circuit cannot be implemented by means of SMDs alone.

The main advantages of SMD technology lie in the miniaturization, in advantageous RF characteristics, in a very high quality standard and in a cost reduction both in the case of the components and in the case of the circuit bard.

So-called SMD chip resistors have also become known as components in SMD technology. These, like the other SMD components, have a uniform constructional size of 3.2 mm length, 1.6 mm width and 0.6 mm thickness. A ceramic material of high purity (aluminium oxide, silicon) is used as substrate for applying the resistance layer as is generally done in the screen printing method. The composition of the layering of the resistance track is selected in such a manner that the desired resistance is approximately achieved. The rated resistance can then be fixed by so-called laser trimming. To protect the resistance area, the component is covered with a glaze. At the ends of the component, end contacts of metal are applied which can be constructed of several layers. To achieve a reliable connection between end contacts the and resistance layer, a base minaturization is provided.

In addition to such SMD chip resistors, so-called SMD ceramic multi-layer chip capacitors have also become known as components which are constructed in accordance with known methods. Furthermore, tantalum chip capacitors or electrolytic aluminium chip capacitors are known. Finally, transistors and diodes which are uniformly adapted to the dimensions exist as SMD components.

From DE 37 41 175 A1, a variable resistor has become known which can be handled as an insulated component also in SMD technology, that is to say, could be soldered onto a board as a separate component. This component consists of a carrier layer with an applied resistance track and inserted potentiometer slider. Such a variable resistor could also be used on a board in SMD technology, particularly as a trimming potentiometer. It has the advantage that it can be produced as a separate component independently of the beard production.

SUMMARY OF THE INVENTION

The invention is based on the object of creating a rheostatic device in switching arrangement, particularly for controlling the speed of electric tools, in which the disadvantages in the integration of a resistance track on the circuit board as described are avoided, that is to say the production process of the overall unit is simplified and improved. In particular, the negative influences during the production of the different circuit board components are to be avoided.

This object is achieved by an electric tool rheostatic device in a switching arrangement for regulating the speed of electric motors in electric tools, comprising: a switch housing; a circuit board for receiving electronic components and being disposed in said switch housing; a manually-operated actuating member; and a potentiometer disposed within said switch housing and comprising: a potentiometer slider operatively connected with said manually-operated actuating member and a resistance track constituted by a chip resistance element produced independently of said circuit board according to surface mounted device technology and mounted on said circuit board independently of said potentiometer slider which, upon assembly of said switching arrangement, is adjustably located on said resistance track by said manually-operated actuating member for controlling resistance. Advantageous and appropriate further developments of the basic concept of the invention are reproduced in the subclaims.

ADVANTAGES OF THE INVENTION

The invention is based on the basic concept of decoupling as far as possible the previously usual production process for the constructional units of "printed circuit board" and "potentiometer resistance track" in the production of a switch board or of an electronics module for a switch. Thus, each constructional unit can be optimally designed with respect to all requirements by itself. Accordingly, the resistance track hitherto applied, for example in paste form, onto the printed circuit board and fired is to be omitted in this decoupling process so that the circuit board is not negatively influenced by this production process. Instead, the resistance track is constructed and processed as a separate component produced in SMD technology. Due to this construction of the resistance track as a separate component, the essential advantage is obtained that both the circuit board and the resistance track can be basically separated and individually optimised in the production process. In this connection, modern production methods such as automatic SMD insertion systems and laser calibration can be used independently of one another. Compared with the previous method, an economical and more flexible large-scale production is possible.

A decisive advantage of the invention is also obtained from the separate method of constructing the SMD resistance track and the associated slider. As a result, the resistance can be produced as a variable SMD component in the most varied configurations and with the most varied resistance values. In this connection, the resistance track can be produced extremely precisely in the separate production process so that an extremely precisely defined component can be applied as a SMD resistance element in SMD technology to the circuit board. The switch board or the electronics module of the switch can be accordingly equipped with various SMD resistance tracks as SMD component. It is only when the switch is assembled that the slider connected to the switch actuating member is placed onto the SMD resistance track. The SMD resistance track accordingly represents a type of "half-part", that is to say it can be provided with various resistances of the switch board. The finished potentiometer is then only produced by assembling the switch itself in that the separate slider is placed onto the SMD component.

In this connection, the resistance track produced in SMD technology can also be provided with additional resistance areas in order to produce a calibration of the resistance value, for example in the laser cut. This method is possible, in particular, by means of the separate provision of an SMD resistance track.

Further details of the invention are shown in the drawings and explained in greater detail with reference to further advantages in the description which follows.

BRIEF DESCRIPTION OF THE DRAWINGS

FIG. 1b shows a detailed view of the SMD potentiometer according to FIG. 1a, FIG. 2 shows the potentiometer arrangement according to FIGS. 1a, 1b as SMD component in various views, in which

DESCRIPTION OF THE ILLUSTRATIVE EMBODIMENT

Figure 1A:
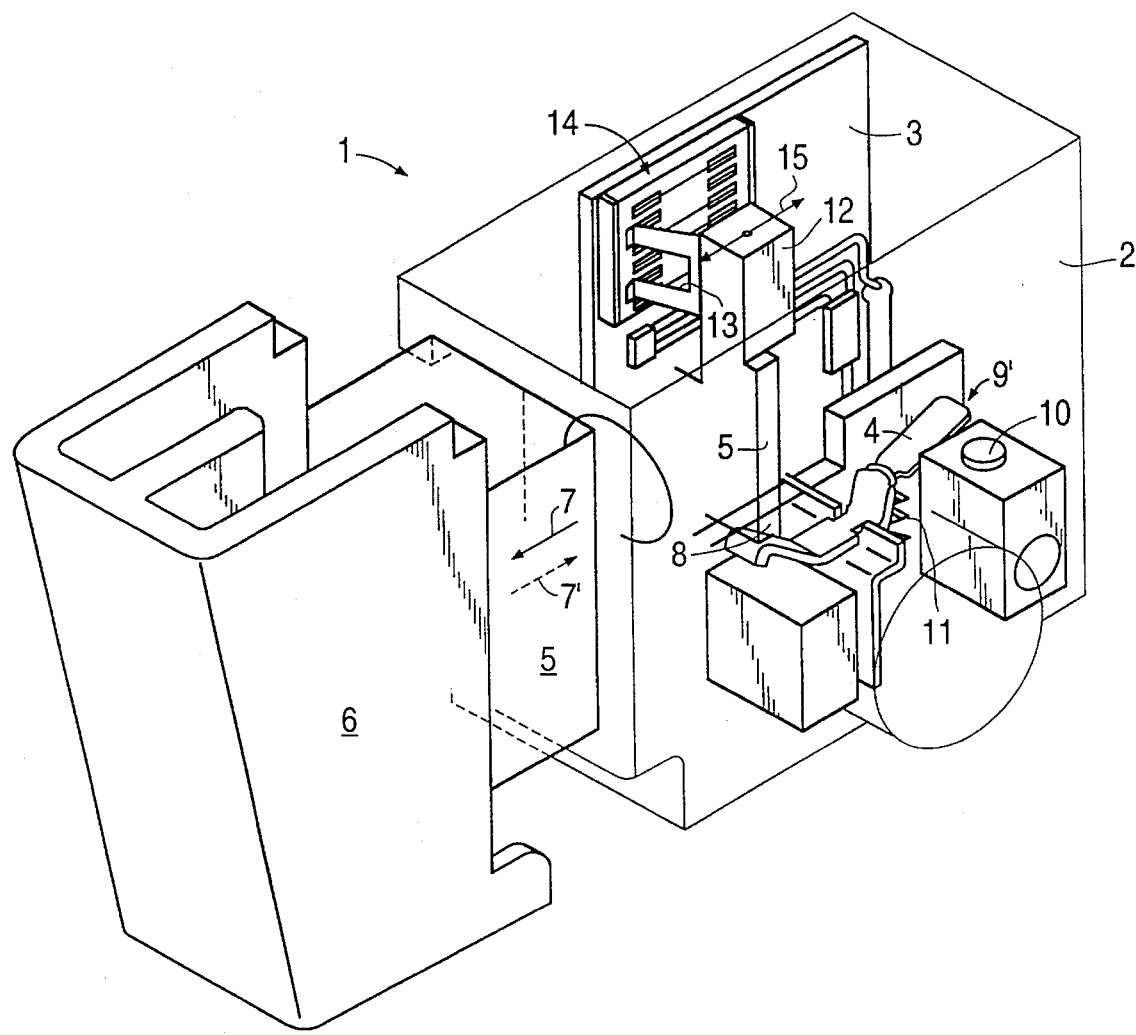
FIG. 1a shows a diagrammatic representation of a rheostatic switching arrangement with a SMD potentiometer in a perspective view.

In particular, the rheostatic device in a switching arrangement 1 shown in FIG. 1a is used for controlling the speed of electric tools such as, for example, hand-operated drilling machines or the like, a known circuit arrangement for phase-gating control, for example, being used for speed control (for example DE 29 14 496 A1). For this purpose, the rheostatic device in a switching arrangement 1 has a switch housing 2 in which a circuit board 3 constructed electronics module is arranged. The circuit board 3 is provided with an equipment of discrete components or also of SMD components. In particular, the production of this circuit board 3 in SMD technology allows the SMD components to be fitted by means of a corresponding automatic insertion equipment with a high clock-frequency. The rheostatic device in a switching arrangement shown in FIG. 1a also exhibits a diagrammatically shown contact rocker 4 which is actuated via an actuating plunger 5 of an actuating member 6 or of a push button 6 in a manner known per se. For this purpose, a compression spring not shown in greater detail presses the actuating plunger 5 towards the outside (arrow 7) so that a switching cam 8 of the actuating plunger 5 presses onto one end 9 of the contact rocker 4 and opens the contact connection between contact rocker 4 and contact 10. With manual actuation of the push button 6, the actuating plunger 5 is pressed towards the inside against the compression spring (arrow 7') so that the contact rocker 4 is relieved at its end 9. A tension spring 11 pulls the other end 9' of the contact rocker down and closes the electrical contact 10.

The actuation of the push button 6, that is to say its linear movement, is transferred via a projection 12 with a slider 13 attached thereto to an SMD resistance element 14. The linear movement of the slider 13 at the projection 12 is shown with arrow 15 in FIGS. 1a, 1b.

Figure 1B:
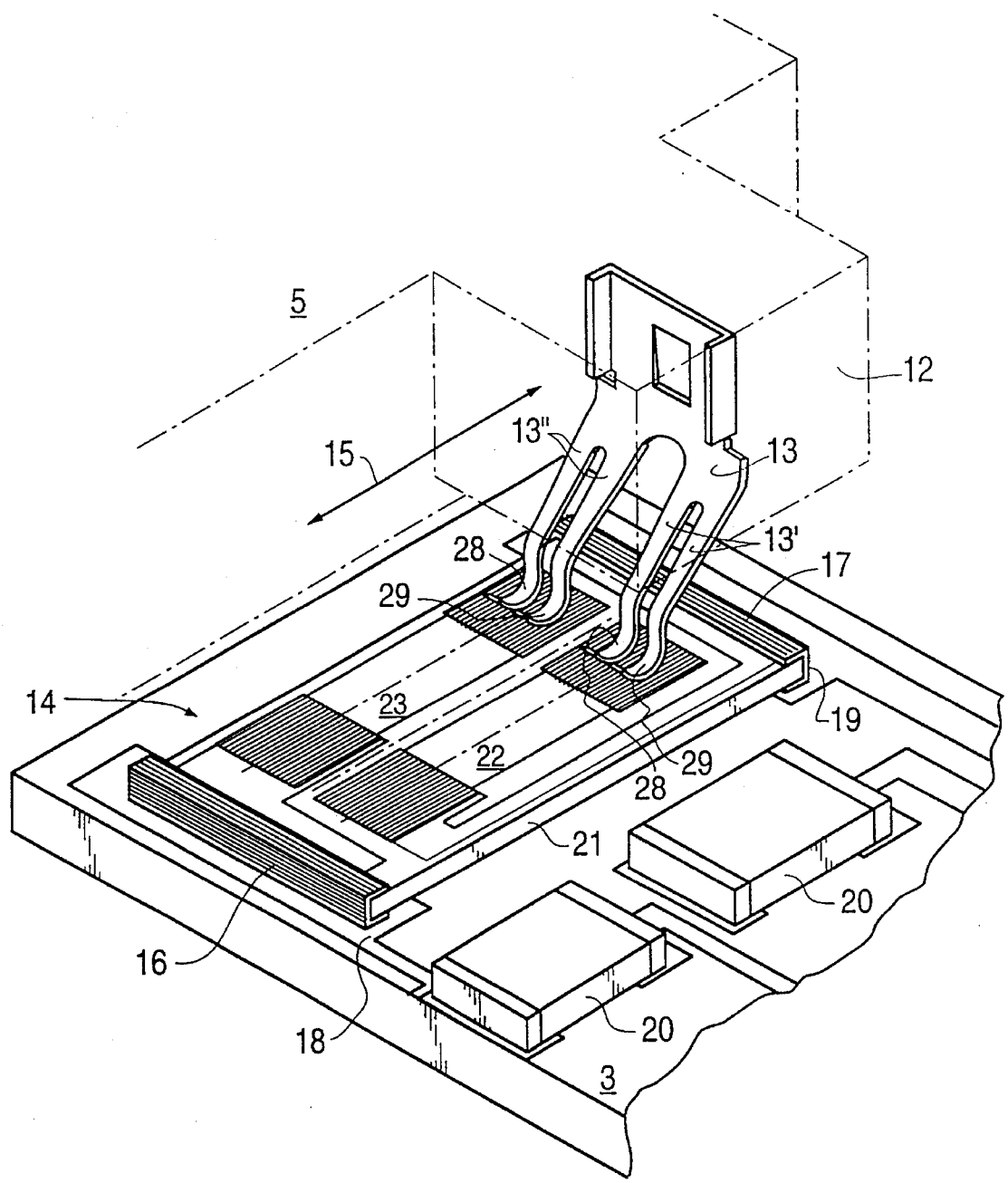

As can also be seen from FIGS. 1a, 1b, the SMD resistance element 14 is constructed as a resistance track which is produced as a SMD chip component and is attached in SMD technology to the circuit board 3 which represents the electronics module for the switch 1. For this purpose, the resistance element 14 exhibits at its two front ends electric end contacts 16, 17 which are electrically connected to in each case one conductor track 18, 19 of the circuit board 3. The SMD resistance element 14 is fitted to the circuit board 3 in the same manner as is normally the case for known SMD components 20.

Figure 2A:
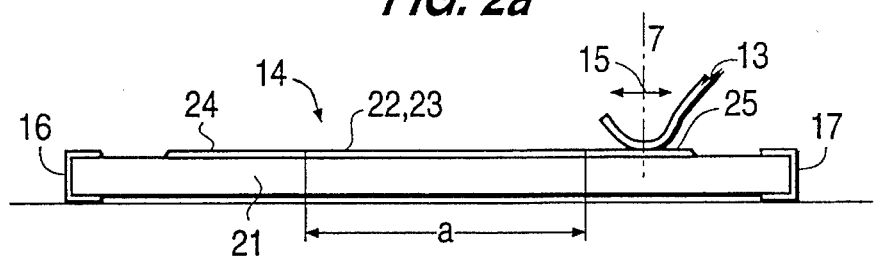
FIG. 2a shows a side view.
Figure 2B:
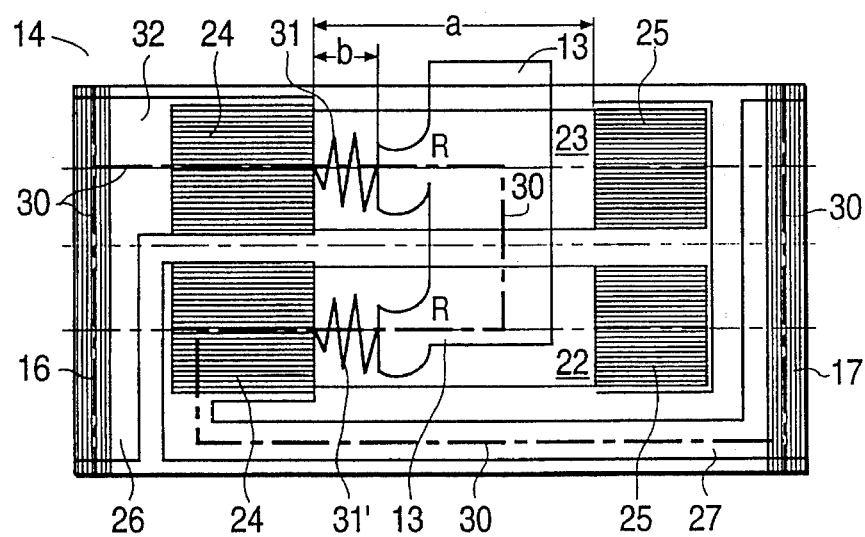
FIG. 2b shows a top view with changed position of the slider and FIG. 2c shows a perspective view of the SMD resistance track without slider and FIGS. 3a–3c show a further SMD component or respectively an SMD resistance track with an additional resistance area for a calibration.
Figure 2C:
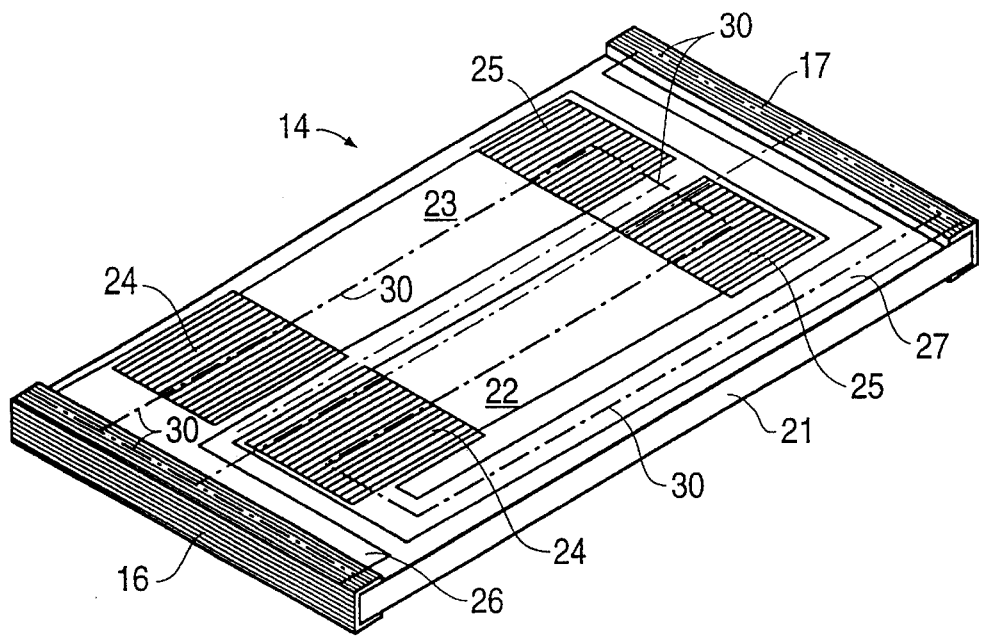

The SMD potentiometer according to the invention, consisting of SMD resistance element 14 and slider 13, is specified in greater detail in FIGS. 1b and 2a to 2c. FIG. 1b shows the potentiometer 13, 14 soldered onto the circuit board 3 whilst FIGS. 2a to 2c show the potentiometer 13, 14 (FIGS. 2a, 2b) and the resistance element 14 by itself, respectively.

The resistance element 14 shown as a SMD component in SMD technology consists of an epoxy resin or a ceramic material of high purity, for example aluminium oxide or silicon, which is used as substrate for the carrier material 21. In the illustrative embodiment, for example, two resistance tracks 22, 23 with a length a are provided which are applied to the carrier material 21 in the screen printing method. The length a can be about 10 to 15 mm. At the end of the resistance tracks 22, 23, the contacting sections 24, 25, the resistance of which remains the same, are located, these sections being connected to the end contacts 16, 17 via feed lines 26, 27. The end contacts 16, 17 are used as an soldering connection on the circuit board 3 to be equipped. The contacting sections 24, 25 at the end of the two resistance tracks 22, 23 are connected to one another via a special double slider 13 in the position according to FIGS. 1b and 2a, respectively. The slider 13 accordingly consists of a U-shaped double arm with the legs 13', 13" which, in turn, are separated, for their part, into two slider arms 28, 29. The slider arms 28, 29 are constructed to be arc-shaped at the lower end.

The separate double slider 13 (connected to the push button 6) is drawn in at the right-hand end stop in FIGS. 1b, 2a and slides along on the resistance tracks 22, 23 (arrow 15) according to the representation in FIG. 2b and, by bridging them, completes a resistance tap which is drawn in in FIG. 2b with the length b, that is to say the resistance tracks 22, 23 are connected electrically in series and have here an effective length of 2×6. In order to reach the resistance tracks 22, 23 with the slider 13, the former being upwards accessibly open. The line 30 shows the current path from the end contact 16 to end contact 17. Reference symbol 31, 31' symbolically represents the sum of the resistances in FIG. 2b, that is to say R (total)=R (31)+R (31').

Reference symbol 32 represents a plateau which can be used as printed area for a zero calibration.

Figure 3A:
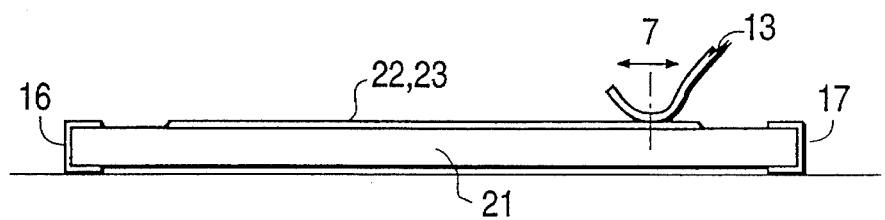
Figure 3B:
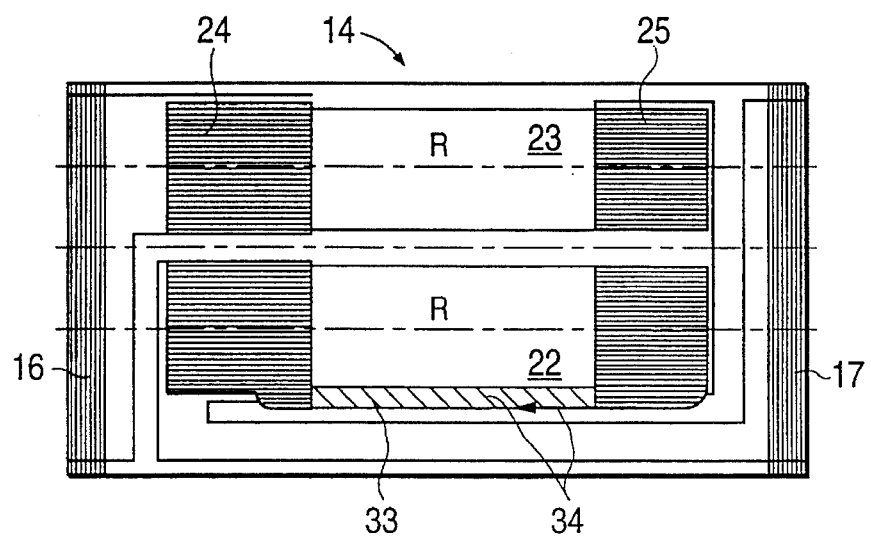
Figure 3C:
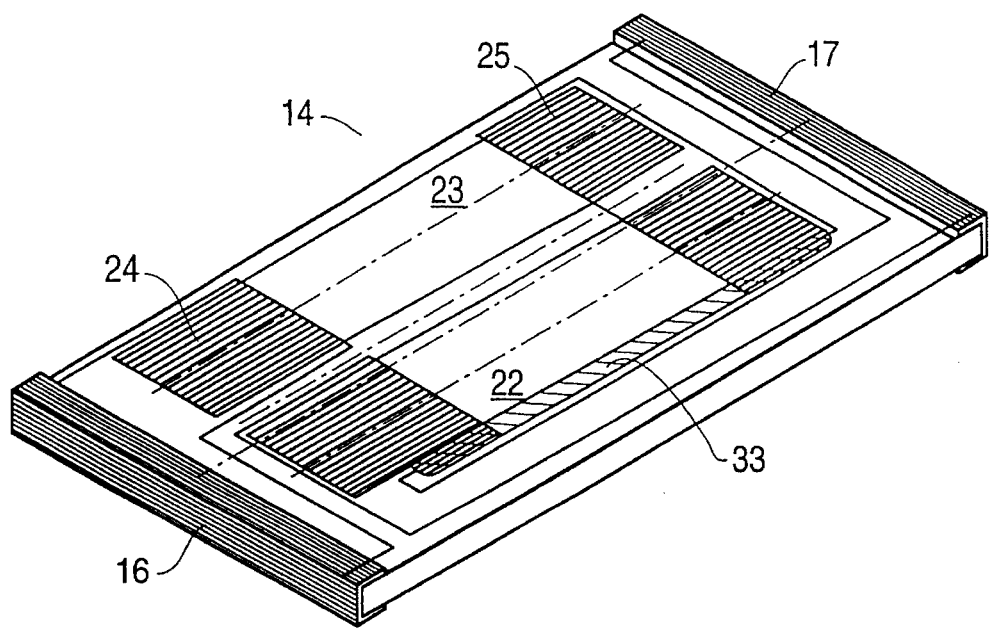

In FIG. 2c, the SMD resistance track is shown in a perspective view without slider 13. Identical parts are provided with identical reference symbols. A further variant is shown in the representation according to FIGS. 3a to 3c. In addition to the actual resistance tracks 22, 23, which are identified by an "R" as in the previous figures, a resistance area 33 which is used for the electrical calibration of the potentiometer or of all the electronics is at the same time defined on the same "SMD chip". Any component tolerance which may occur can be compensated with the aid of a symbolically indicated laser cut 34.

For the rest, the illustrative embodiment according to FIG. 3 corresponds to those of FIGS. 1 and 2. Here, too, the two resistance tracks 22, 23 are applied to a carrier material 21, for example silicon, and produced and processed in the SMD technology known per se.

At the front end, end contacts 16, 17 are again provided which are constructed as a metal frame. In this connection, one or also two or more tracks 22, 23, 33 can be applied, as in the illustrative embodiment according to FIGS. 1 to 3. In side view, the double slider 13 in FIG. 3a for a resistance tap is diagrammatically indicated at its right-hand end position.

In contrast to conventional resistors in SMD technology, the slider 13 can be placed directly onto the SMD resistance track 22, 23 for a resistance tap in the present invention, that is to say the protective cover otherwise customary is omitted in this area.

The SMD resistance elements shown in FIGS. 2 and 3 can be optionally placed onto the circuit board 3 constructed as an electronics module in a switch according to FIG. 1a. The determining factor for the invention is the separate structure between SMD resistance element 14 with associated resistance tracks 22, 23 on the circuit board 3, as a result of which, in conjunction with the double slider 13, a flexible resistor, that is to say an SMD potentiometer, is provided in a switch.

Naturally, the SMD chip resistance element according to the invention can also be used in conjunction with the separate slider, as another potentiometer control element in connection with electronic circuits.

We claim:

1. An electric tool rheostatic device in a switching arrangement, particularly for regulating the speed of electric tools, comprising a circuit board arranged in a switch housing for accommodating electronic components, and a resistance track provided on the circuit board for a variable resistor, on which a slider slides which is adjustable by means of an actuating member of the switch, characterised in that the resistance track is constructed as a separate surface mounted device (SMD) chip resistance element which can be placed onto the circuit board of an electronics module independently of the potentiometer slider and can be handled independently of the slider, said SMD resistance element having a carrier substrate on which at least one resistance track is mounted to be upwardly accessibly open, and at both ends of the SMD resistance element, metallic end contacts for contacting the SMD resistance element on a circuit board are provided which are connected to the resistance track.

2. An electric tool rheostatic device in a switching arrangement according to claim 1, characterised in that the resistance track is applied as a carbon track or the like, preferably in the screen printing method.

3. An electric tool rheostatic device in a switching arrangement according to claim 1, characterised in that the carrier substrate consists of a ceramic or epoxy resin carrier.

4. An electric tool rheostatic device in a switching arrangement according to claim 1, characterised in that the SMD resistance element exhibits at least two parallel resistance tracks which are applied to the carrier substrate.

5. An electric tool rheostatic device in a switching arrangement according to claim 4, characterised in that the slider is constructed as double slider for bridging the parallel resistance tracks, the resistance tracks being connected to said end contacts at their two opposite ends (series connection of the resistance tracks).

6. An electric tool rheostatic device in a switching arrangement according to claim 4, characterised in that the end contacts are connected to the resistance tracks via feed lines.

7. An electric tool rheostatic device in a switching arrangement according to claim 4, characterised in that the end regions of each resistance track are provided with contacting sections.

8. An electric tool rheostatic device in a switching arrangement according to claim 4, characterised in that an additional resistance area, which is variable by means of a laser cut for a calibration of the resistance value, is associated with the resistance tracks.

9. An electric tool rheostatic device in a switching arrangement for regulating the speed of an electric motor in an electric tool, comprising:
   a switch housing;
   a circuit board for receiving electronic components and being disposed in said switch housing;
   a manually-operated actuating member; and
   a potentiometer disposed within said switch housing and comprising:
      a potentiometer slider operatively connected with said manually-operated actuating member; and
      a resistance track constituted by a chip resistance element produced independently of said circuit board according to surface mounted device technology and mounted on said circuit board independently of said potentiometer slider which, upon assembly of said switching arrangement, is adjustably located on said resistance track by said manually-operated actuating member for controlling resistance, said chip resistance element including a carrier substrate and at least one resistance track applied to said carrier substrate to be upwardly accessibly open, two oppositely located ends, and a metallic end contact at each respective end connected to a respective resistance track and being for contacting said chip resistance element to said circuit board.

10. An electric tool rheostatic device in a switching arrangement as defined in claim 9, wherein said at least one resistance track comprises carbon.

11. An electric tool rheostatic device in a switching arrangement as defined in claim 10, wherein said at least one carbon resistance track is screen printed on said carrier substrate.

12. An electric tool rheostatic device in a switching arrangement as defined in claim 10, wherein the carrier substrate is comprised of at least one of ceramic and epoxy resin carrier.

13. An electric tool rheostatic device in a switching arrangement as defined in claim 10, wherein said chip resistance element has two parallel resistance tracks applied to the carrier substrate.

14. An electric tool rheostatic device in a switching arrangement as defined in claim 13, wherein said potentiometer slider comprises a double slider for bridging the parallel resistance tracks, and wherein each resistance track has two oppositely located ends, each resistance track having one end connected with a respective end contact.

15. An electric tool rheostatic device in a switching arrangement as defined in claim 13, and further comprising a feed line for connecting each metallic end contact to a respective resistance track.

16. An electric tool rheostatic device in a switching arrangement as defined in claim 9, wherein the resistance track has end regions each including a contacting section.

17. An electric tool rheostatic device in a switching arrangement as defined in claim 9, wherein said chip resistance element includes an additional resistance region having a resistance that can be varied by a laser cut for calibrating a resistance value associated with the resistance track.

* * * * *